United States Patent
Adams et al.

(10) Patent No.: US 6,670,624 B1
(45) Date of Patent: Dec. 30, 2003

(54) ION IMPLANTER IN-SITU MASS SPECTROMETER

(75) Inventors: Edward D. Adams, Richmond, VT (US); Edward P. Lowe, Jr., St. Albans, VT (US); Nicholas Mone, Jr., Essex Junction, VT (US); Donald W. Rakowski, Milton, VT (US); Richard S. Ray, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,996

(22) Filed: Mar. 7, 2003

(51) Int. Cl.[7] .......................... B01D 59/44; H01J 49/00; G01N 23/00; G21K 7/00; G21K 5/10
(52) U.S. Cl. .................. 250/492.21; 250/306; 250/307; 250/309; 250/505.1; 250/227; 250/281; 250/282; 250/423 R; 250/492.1; 250/492.2; 250/492.3
(58) Field of Search .......................... 257/190; 250/306, 250/307, 309, 505.1, 227, 281, 282, 423 R, 492.1, 492.2, 492.21, 492.3

(56) References Cited

U.S. PATENT DOCUMENTS

| | | | |
|---|---|---|---|
| 4,435,642 A | | 3/1984 | Neugebauer et al. |
| 4,827,121 A | * | 5/1989 | Vidrine et al. ............... 356/451 |
| 5,059,785 A | * | 10/1991 | Doyle et al. ................. 250/309 |
| 5,343,047 A | * | 8/1994 | Ono et al. ................. 250/492.21 |
| 5,393,986 A | * | 2/1995 | Yoshinouchi et al. .. 250/492.21 |
| 5,539,203 A | * | 7/1996 | Ohdomari .............. 250/492.21 |
| 5,625,204 A | * | 4/1997 | Kao et al. .................... 257/190 |
| 5,969,366 A | * | 10/1999 | England et al. ........ 250/492.21 |
| 6,101,971 A | * | 8/2000 | Denholm et al. ......... 118/723 E |
| 6,160,262 A | * | 12/2000 | Aoki et al. ............. 250/492.21 |

FOREIGN PATENT DOCUMENTS

| | | |
|---|---|---|
| JP | 2-37657 | 2/1990 |
| JP | 5-135730 | 5/1993 |
| JP | 9-45274 | 2/1997 |
| JP | 11-86775 | 5/1999 |
| JP | 2000-306540 | 11/2000 |

* cited by examiner

Primary Examiner—John R. Lee
Assistant Examiner—Mary El-Shammaa
(74) Attorney, Agent, or Firm—Scully, Scott, Murphy & Presser; Anthony J. Canale

(57) ABSTRACT

An apparatus for the in-situ detection of ions in a beam of an ion implanter device includes a mass spectrometer device having inner and outer walls and, a system for generating and directing an ion implant beam through the mass spectrometer device. The mass spectrometer device generates a magnetic field for directing ions of the ion implant beam of a desirable type through an aperture for implanting into a semiconductor wafer, and causing ions of undesirable type to collide with the inner or outer wall. For in-situ detection, a detector device is disposed on the inner and outer walls of the mass spectrometer for detecting the undesirable type of ions deflected. In one embodiment, the detector device comprises electronic sensor devices for detecting a concentration of the undesirable type ions which comprise undesirable elements and compounds. In another embodiment, the detector device comprises Faraday cup devices for detecting a concentration of ions of the undesirable type, or, may comprise a moving Faraday device positioned along tracks disposed respectively along the inner and outer wall, the Faraday being driven for reciprocal movement along a respective track. Data is collected from the sensors corresponding to the positions of undesirable ion detection and is processed, in real-time, during wafer processing. In this manner potential contaminants in the ion implant beam may be determined and corrective action may be taken in response.

18 Claims, 3 Drawing Sheets

FIG. 4
FIG. 5
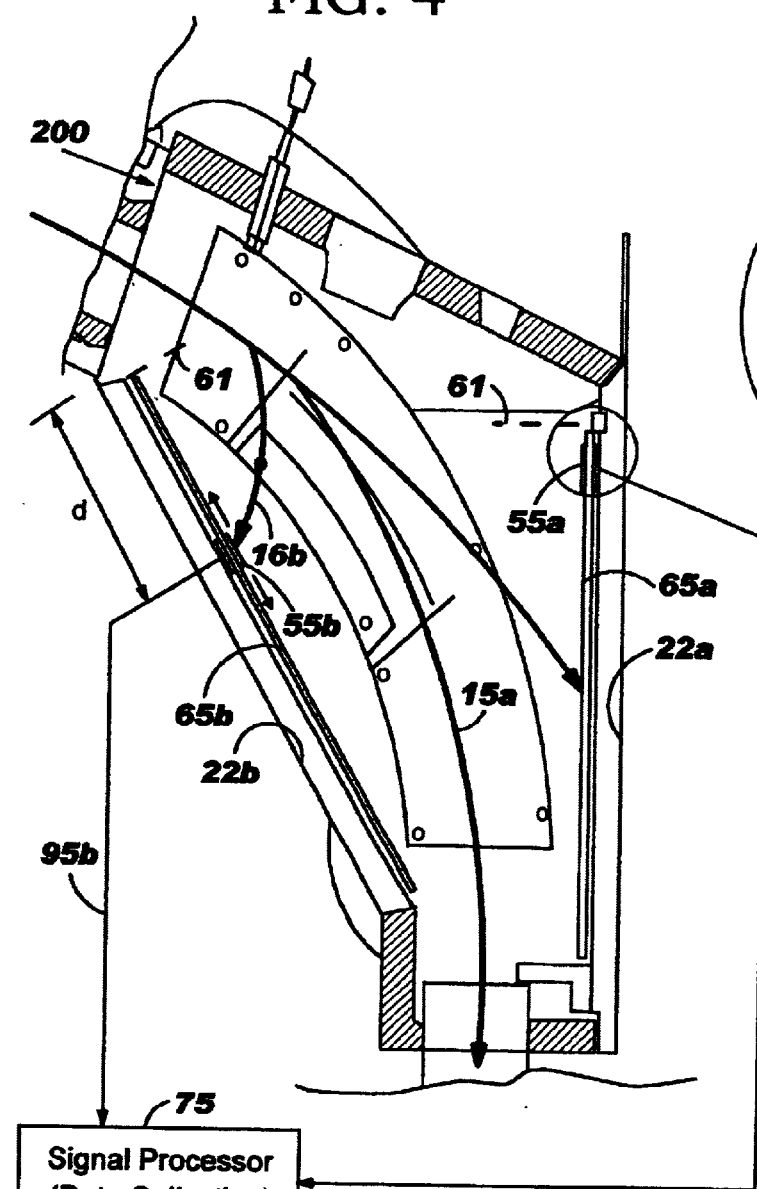
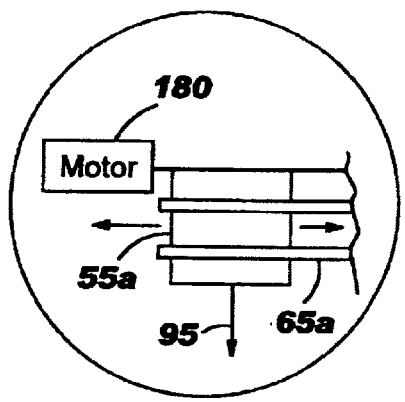
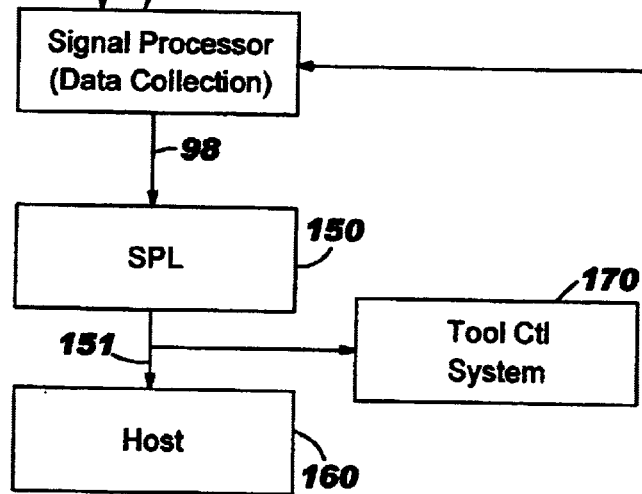

ION IMPLANTER IN-SITU MASS SPECTROMETER

BACKGROUND OF THE INVENTION

1. Field of the Invention

The present invention relates to semiconductor processing in general, and particularly, to a novel apparatus for in-situ detection of ions in an ion implant beam during wafer processing.

2. Description of the Prior Art

FIG. 1 is a schematic diagram depicting an ion beam implantation device 10, such as an Axcelis GSD-200 Beam Line (Axcelis Technologies, Beverly Mass.), which is a low energy and high current implanter for high-speed wafer handling in advanced ion implant manufacturing processes.

The ion beam implantation device includes an ion source 12 including a gas delivery system for producing an ion beam 15. The ion beam passes through a pre acceleration section, known as the source extraction 18. During ion implantation, the ions extracted from the source contain many kinds of ions, and ionized compounds, that are either of a species desired for implantation, or not. A mass spectrometer unit (or mass analyzing magnet) 20 positioned along the beam path between the source and a process chamber 25 filters ions from the beam while allowing ions of the desired species to exit aperture slits 28 provided in the implanter's post acceleration assembly 30 and enter the process chamber. The magnet 21 includes multiple magnet pole pieces constructed from a ferromagnetic material and having inwardly facing pole surfaces. Particularly, to sort the desired ions from the supply of ions, the ions are accelerated through a series of magnets, an analyzer magnet, where the magnetic fields are set so that the ions of an ion beam 15 of the desired species are deflected in a deflection region 36, make a turn, and travel through the aperture slits 28 for implantation onto the wafers. The relationship between the magnetic field (B), the ion accelerating voltage (V), the mass-to-charge ratio (m/q in atomic mass units per proton charge), and the radius of ion curvature (r) in the magnetic field, i.e., $m/q=(B^2/2V)r^2$, is well known to skilled artisans. The magnetic fields of the mass spectrometer 20 are thus adjusted so that the interaction with ions of the desired species to be implanted (i.e., having ions of desired mass/charge ratio and velocity) are deflected in a manner so that they exit the mass spectrometer device 20 and ion implanter 10 for implantation in a wafer (not shown). That is, the resulting desired ion beam species 15a is caused to pass through an aperture slit 28 for implantation in the process chamber 25. With respect to undesirable ions, ion compounds and contaminants, e.g., ions 16a, 16b in FIG. 1, these ions interact with the magnetic field in a manner such that they are deflected and collide with the graphite walls 22a, 22b of the mass spectrometer unit 20. Such undesirable ions comprise contaminants which may be passed with the desired ions, such as $BF_2$, or other implanted species. With respect to the ion beam that passes through the mass spectrometer, as shown in FIG. 1, a Faraday cup 38 is arranged in the process chamber 25 and beam line 15a, corresponding to an ion beam shooting position. The Faraday cup device 38 is implemented for measuring the current of the ion beam of the desired species, without significantly affecting the flow of ions to the wafer.

A way of determining the other ions being extracted from the source is to ramp the magnet current of the analyzer magnet (where the magnet current to ion/mass relationship is known) and measure the resulting ion beam current, stating the presence, and quantity of certain ion masses. The problem is that this technique takes time away from the manufacturing operation of the tool, and can only be measured while the ion beam is not implanting the wafers (i.e., off-line).

Thus, it is the case that ion beam spectrums may currently be performed, which is a time consuming process, and cannot be done while the wafers are actually being implanted with desired ions. Another technique is to connect an RGA (Residual Gas Analyzer) to the chamberâ€¦ but this has the disadvantage of measuring only certain materials, and not ionized ones, and not ionized compounds.

It would be highly advantageous to provide a ion implanter in situ mass spectrometer that would allow the components of the ion beam to be measured continuously, even while the wafer is being implanted.

BRIEF SUMMARY OF THE INVENTION

It is an object of the present invention to provide an apparatus for detecting ions in an ion implant beam in real time during wafer processing.

The invention consists of imbedding a strip of current detectors into the graphite shields along the walls of the analyzer magnet channel, connected by a multi-channel detector. This would allow continuous monitoring of the beam current (and quantity) of ion beam contaminants.

Thus, according to a first aspect of the invention, there is provided an apparatus for the in-situ detection of ions in an ion beam implanter beam includes a mass spectrometer device having inner and outer walls and, a system for generating and directing an ion implant beam through the mass spectrometer device. The in-situ mass spectrometer device generates a magnetic field for directing ions of the ion implant beam of a desirable type through an aperture for implanting into a semiconductor wafer, and causing ions of undesirable type to collide with the inner or outer wall. A detector device is disposed on the inner and outer walls for detecting the second type of ions deflected.

According to a further aspect of the invention, there is provided a mass spectrometer device for the in-situ detection of ions, the device comprising:

an inner wall, an outer wall and an aperture defining an area through which an ion implant beam is directed for implanting into a semiconductor wafer;

means for generating a magnetic field for interacting with the ions of the implant beam, the ions comprising ions of a desirable type to be directed through the aperture, and ions of undesirable type, the magnetic field interacting with the undesirable type ions to collide with the inner or outer walls; and, a detector device disposed on the inner and outer walls for detecting the ions of the undesirable type.

In one embodiment, the detector device comprises electronic sensor devices for detecting a concentration of the second or undesirable type ions. In another embodiment, the detector device comprises Faraday cup devices for detecting a concentration of ions of the second or undesirable type ions, or, may comprise a Faraday device positioned along tracks disposed respectively along the inner and outer wall, the Faraday being driven for reciprocal movement along a respective track. Data is collected from the sensors corresponding to the positions of undesirable ion detected and is processed, in real-time, during wafer processing. In this manner, potential contaminants in the ion implant beam may be determined and corrective action may be taken in response.

BRIEF DESCRIPTION OF THE SEVERAL VIEWS OF THE DRAWINGS

Preferred embodiments of the invention will now be described, by way of illustrative and non-limiting examples, with reference to the accompanying drawings in which:

FIG. 4 is a schematic illustration of an apparatus for detecting ions in an ion implant beam in real time during wafer processing according to a second embodiment of the invention; and FIG. 5 is a close up view of a moving Faraday cup 55a disposed for movement along a track 65a located at the outer wall of the ion implanter in-situ mass spectrometer apparatus 200.

DETAILED DESCRIPTION OF THE INVENTION

Figure 1:
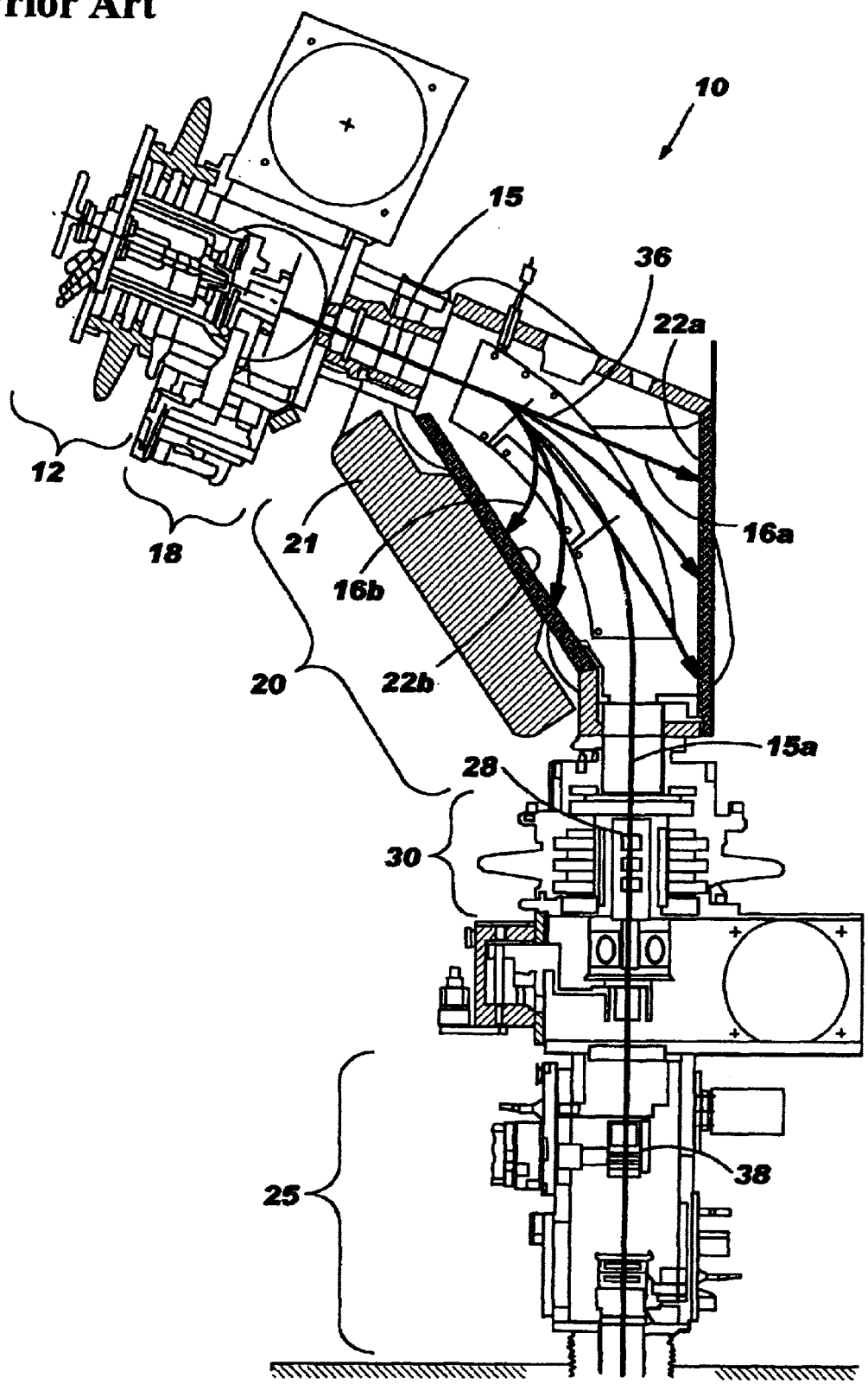
FIG. 1 is a schematic diagram of a typical high current ion beam implanter.
Figure 2:
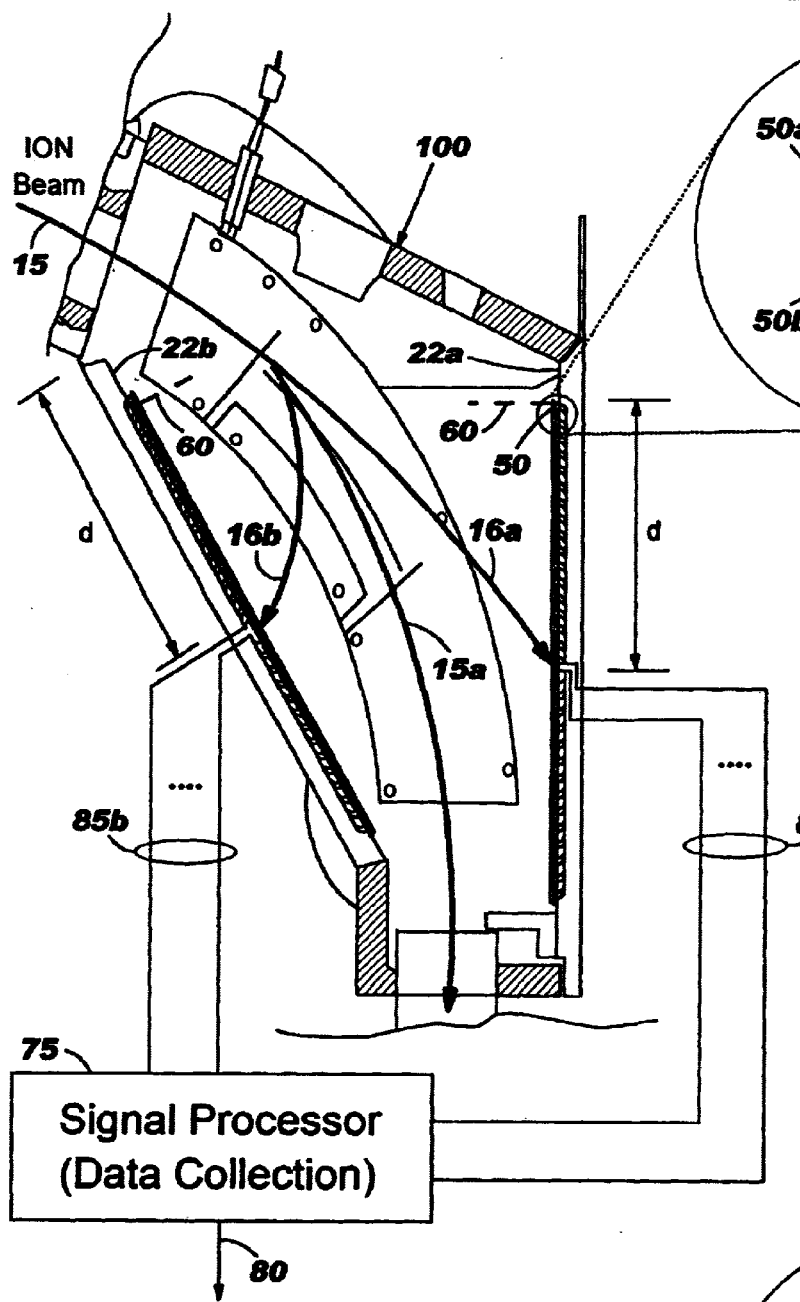
FIG. 2 is a schematic illustration of an apparatus for detecting ions in an ion implant beam in real time during wafer processing according to a first embodiment of the invention.

FIG. 2 is a schematic illustration of a novel ion implanter in-situ mass spectrometer apparatus 100 according to a first embodiment of the invention. This in-situ mass spectrometer apparatus 100 is preferably incorporated in the ion beam implanter 10 of FIG. 1 for filtering and identifying, in real time, any undesirable ions that may be included in the generated ion implant beam 15 during wafer processing, and passing the desired ion beam 15a having ions of desired mass/charge ratio and velocity through the ion implanter for implantation in a wafer.

As shown in FIG. 2, the ion implanter in-situ mass spectrometer apparatus 100 according to the first embodiment comprises a plurality of electronic sensor devices 50 mounted on or embedded within the graphite shielded walls 22a, 22b of the mass spectrometer 100. These sensors 50 particularly detect the undesirable ions and ion compounds that are deflected by the magnetic field and additionally provide a signal of a strength corresponding to the amount of ions detected or their concentrations. In an alternate embodiment, the sensors for detecting the deflected undesirable ions and ion compounds may comprise multiple Faraday cups. In either embodiment, the embedded sensors 50 or multiple Faraday cups are located linearly along the wall 22a, 22b or, at locations along the wall where it is anticipated that undesirable contaminant ions may be deflected to strike the wall according to their interaction with the magnetic field applied by the analyzer magnet. As shown in FIG. 2, the embedded sensors 50 are located in a linear fashion along the inner wall 22b and outer wall 22a of the mass spectrometer unit 100. Preferably, all sensor devices 50 are located at precise locations relative to a reference location 60 corresponding to the location where the ion beam 15 enters the unit at a known ion energy, and interacts with the magnetic field. Additionally, each mounted sensor device 50 communicates with a central processing device 75, for example, by conductors 85a, 85b so that it may receive the signals generated from a specific sensor. In a manner as will be explained in greater detail, the signal processor 75 receives signals from the embedded sensors as they detect the deflected ions, and collects the data for real time processing. From the initial ion beam 15 entering the mass spectrometer 100 at a desired speed, undesirable ions that are lighter than the ions of the desired species are bent towards the inner wall 22b and the undesirable heavier ions that are deflected to strike the outer wall 22a. As the embedded sensor devices 50 are at known locations relative to the reference location 60, the distance from the reference location 60 where the undesirable ions are detected by a sensor is used to determine the radius of their deflection trajectory in response to interaction with the known magnetic field. From the signal generated by the detecting sensor, the location or detected distance "d" as indicated in FIG. 2, which corresponds to the detected location of the deflected undesired ions 16a, 16b, is determined. The signal processor device 75 determines from the distance information, a radius of ion curvature (r) in the magnetic field. Further, from the well known relation $m/q=(B^2/2V)r^2$ inter-relating the applied magnetic field (B) and the ion accelerating voltage (V) (both known values), a mass-to-charge ratio (m/q) for these deflected undesired ions may be determined by the signal processor 75. From the determined mass-to-charge value of the detected undesirable ions, the corresponding undesired ion or ionic compound is identified, in real time, by the signal processor device 75. It is understood that all types of charged particles (ions) may be detected by the sensors and collected so that all undesirable ions present in the ion beam may be determined. It is understood that each embedded sensor (or Faraday cup) device additionally detects a concentration of the ions impinging to generate a current. Thus, from the compositions and concentrations (current) of these detected ions, the signal processing device 75 may generate a real-time control signal 80 which may utilized to change processing conditions at the ion beam source to reduce the generation of undesirable ions, for example, setting a process limit, or take any other corrective action, if necessary, such as notifying an operator or, even terminating the implantation process. This is described in greater detail with respect to FIG. 4.

Figure 3A:
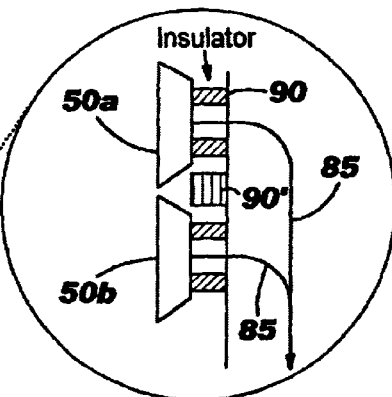
FIG. 3(a) is a close up view of two adjacently located embedded sensor devices (or Faraday cups) 50a, 50b along the outer wall of the ion implanter in-situ mass spectrometer apparatus 100
Figure 3B:
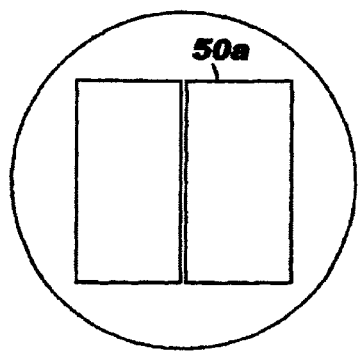
FIG. 3(b) illustrates a front view of the sensor device (or Faraday cup).

FIG. 3(a) is a close up view of two adjacently mounted sensor devices (or Faraday cups) 50a, 50b along the outer wall 22a of the ion implanter in-situ mass spectrometer apparatus 100. FIG. 3(b) illustrates a front view of the sensor device (or Faraday cup) 50a. As shown in FIGS. 2 and 3(a), each device 50a, 50b is attached to the wall and insulated therefrom by insulative material 90 to prevent short circuits. As mentioned, each sensor device communicates signals via a respective electrical connection 85 to the signal processor 75 so that the signal generated by the specific sensor in response to detection of undesirable ions may be transmitted directly to the signal processor 75 or like data collection/processing device for instant analysis of composition and concentration (how much contaminant is present).

FIG. 4 depicts the ion implanter in-situ mass spectrometer apparatus 200 according to a second embodiment. In the second embodiment, the embedded sensors or Faraday cups are replaced by a moving Faraday cup 55a, 55b, which sweeps along a respective track 65a, 65b provided on the inner wall 22b and outer wall 22a of the mass spectrometer device. The sweep frequency at which the moving Faraday cup reciprocates along each track 65a, 65b is a design consideration, dependant upon the ion source materials, ion beam energy and currents involved, and dependent upon the type of ion contaminant to be monitored or detected. As known, the moving Faraday cups 55a, 55b function to detect the ions and ion compounds 16a, 16b that are deflected by the magnetic field and generate a corresponding signal which may be input to the signal processor 75 via signal communication lines 95a, 95b in accordance with the detection. As in the first embodiment, each respective moving Faraday cup and track that it travels on is positioned relative to a reference location 61 relative to where the ion beam 15 and any contaminant ions enters the unit before being deflected. As the position of the moving Faraday 55a, 55b on its track is known with respect to its respective reference location 61, the distance from the reference location 61 where the undesirable ions are detected by the moving Faraday is used to determine the radius of their deflection trajectory in response to interaction with the known magnetic field. From the signal generated by the detecting sensor, the location or detected distance "d" as indicated in FIG. 2, which corresponds to the detected location of the deflected undesired ions 16a, 16b, is determined. The signal processor device 75 then determines from the distance information, a radius of ion curvature (r) in the magnetic field according to the well known relation $m/q=(B^2/2V)r^2$. From the determined mass-to-charge value of the detected undesirable ions, the corresponding undesired ion or ionic compound is identified, in real time, by the signal processor device 75. It is understood that all types of charged particles (ions) may be detected by the moving Faraday cup and collected so that all undesirable ions present in the ion beam may be determined. It is understood that the moving Faraday cup according to this embodiment further detects a concentration of the ions impinging to generate a current signal. Thus, from the compositions and concentrations (current) of these detected ions, the signal processing device 75 may generate real-time control signals 98 which may be input to a statistical process controller 150 which may be programmed to set limits or process windows for controlling the ion beam source depending upon the data collected. Thus, for instance as shown in FIG. 4, the statistical process controller 150 may generate a signal 151 which may be input to the host (fabrication) processor 160 or, tool control system 170 for controlling ion implantation device operations.

FIG. 5 is a close up view of a moving Faraday cup 55a disposed for movement along a track 65a located at the outer wall 22a of the ion implanter in-situ mass spectrometer apparatus 100. As shown in FIG. 5, a motor drive apparatus 180 is provided for enabling sweeping movement of the Faraday cup along its track. The moving Faraday cup additionally includes electrical connections 95 to the signal processor 75 so that a signal representing the cup's position and signal generated by the specific sensor(s) in response to detection of undesirable ions may be transmitted directly to the signal processor data collector 75 and statistical process controller device 150 for instant analysis of composition and concentration (how much contaminant is present).

Thus, according to the invention, and embodiments described herein, the components of the ion beam 15 may be measured continuously, even while the wafer is being implanted. The in-situ mass spectrometer 100, 200 selects the desired ions 15a for implanting into the wafer while the undesired ions hit the walls of the mass spectrometer unit. Detectors, be it embedded sensors, multiple faradays, or a moving Faraday, are positioned along the walls of the mass spectrometer unit to detect the undesired ions to be deflected by the applied magnetic field. For a given desired ion to be implanted, there are corresponding undesired ions that are produced. Knowing these corresponding undesired ions allows for the detection of implanting errors in real time due to the lack or addition of certain undesired ions. Ionic contaminants (e.g., from a vacuum leak) may also be detected.

While the present invention has been particularly shown and described with respect to preferred embodiments thereof, it will be understood by those skilled in the art that the foregoing and other changes in form and detail may be made without departing from the scope and spirit of the present invention. It is therefore intended that the present invention not be limited to the exact forms described and illustrated, but fall within the scope of the appended claims.

What is claimed is:

1. An apparatus for the in-situ detection of ions in a beam of an ion implanter device comprising:
   means for directing an ion implant beam through a mass spectrometer device, said mass spectrometer device having an inner wall an outer wall and an aperture;
   means for generating a magnetic field of a magnitude and direction for directing ions of a desirable type through the aperture for implanting into a substrate, and causing ions of undesirable type to collide with said inner or outer walls; and,
   a detector device disposed on at least one of the inner or outer walls prior to the aperture for detecting the undesirable type of ions.

2. The apparatus according to claim 1, wherein the detector device comprises an electronic sensor device for detecting a concentration of ions of said undesirable type.

3. The apparatus according to claim 1, wherein the detector device comprises a Faraday cup device for detecting a concentration of ions of said undesirable type.

4. The apparatus according to claim 1, wherein the detector device comprises first and second Faraday cup devices positioned along respective first and second tracks, a track disposed respectively along said inner and outer wall, the Faraday cup devices being driven for reciprocal movement along a respective inner and outer wall.

5. The apparatus according to claim 1, wherein said ions of said undesirable type correspond to potential contaminants in the ion implant beam.

6. The apparatus according to claim 1, wherein said detector device is located at a specific location on an inner or outer wall corresponding to a trajectory of a specific type of undesirable ion when interacting with said magnetic field to identify said undesirable ion in the ion implant beam.

7. The apparatus according to claim 6, wherein said detector device generates a signal corresponding to a specific location where ions of said undesirable type are detected, said detector in communication with a processing device for receiving said signal for processing thereof.

8. The apparatus according to claim 6, wherein said detector device generates a signal corresponding to a concentration of detected ions of said undesirable type, said detector in communication with a processing device for receiving said signal for processing thereof.

9. The apparatus according to claim 7, wherein said signal processing device receives said signal from said detector device to identify potential contaminants in the ion implant beam.

10. The apparatus according to claim 1, wherein the detector device is disposed on the inner wall.

11. The apparatus according to claim 1, wherein the detector device is disposed on the outer wall.

12. A mass spectrometer device for the in-situ detection of ions, said device comprising:
   an inner wall, an outer wall and an aperture defining an area through which an ion implant beam is directed for implanting into a semiconductor wafer;
   means for generating a magnetic field for interacting with ions of said implant beam, said ions comprising ions of a desirable type to be directed through said aperture for implantation, and ions of undesirable type, said magnetic field interacting with said undesirable type ions to collide with said inner or outer walls; and, a detector device disposed on at least one of said inner or outer walls prior to said aperture for detecting the ions of said undesirable type.

13. The mass spectrometer device according to claim 12, wherein the detector device comprises an electronic sensor device for detecting a concentration of ions of said undesirable type.

14. The mass spectrometer device according to claim 12, wherein the detector device comprises a Faraday cup device for detecting a concentration of ions of said undesirable type.

15. The mass spectrometer device according to claim 12, wherein the detector device comprises first and second Faraday cup devices positioned along respective first and second tracks, a track disposed respectively along said inner and outer wall, the Faraday cup devices being driven for reciprocal movement along a respective inner and outer wall.

16. The mass spectrometer device according to claim 12, wherein said detector device is located at a specific location on an inner or outer wall corresponding to a trajectory of a specific type of undesirable ion when interacting with said magnetic field to identify said undesirable ion in the ion implant beam.

17. The apparatus according to claim 12, wherein the detector device is disposed on the inner wall.

18. The apparatus according to claim 12, wherein the detector device is disposed on the outer wall.

* * * * *